(12) United States Patent
Chen et al.

(10) Patent No.: US 12,268,301 B2
(45) Date of Patent: Apr. 8, 2025

(54) SLIDE RAIL MECHANISM

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 106 days.

(21) Appl. No.: 18/321,150

(22) Filed: May 22, 2023

(65) Prior Publication Data
US 2024/0237821 A1    Jul. 18, 2024

(30) Foreign Application Priority Data

Jan. 13, 2023    (TW) .................................. 112101919

(51) Int. Cl.
*A47B 88/49*     (2017.01)
*A47B 88/447*    (2017.01)

(52) U.S. Cl.
CPC ............ *A47B 88/49* (2017.01); *A47B 88/447* (2017.01); *A47B 2210/007* (2013.01)

(58) Field of Classification Search
CPC ......... A47B 88/40; A47B 88/70; A47B 88/02; A47B 88/407; A47B 88/0407; A47B 88/49; A47B 88/08; A47B 88/44; A47B 88/443; A47B 2088/4235; A47B 2088/0444; A47B 2210/0064; A47B 2210/0067; A47B 2210/007; H05K 7/1489; H05K 7/183
See application file for complete search history.

(56) References Cited

U.S. PATENT DOCUMENTS

| | | | |
|---|---|---|---|
| 4,696,582 A * | 9/1987 | Kasten ................... | F16C 29/04 384/18 |
| 6,442,031 B1 * | 8/2002 | Liu ...................... | H05K 7/1421 312/334.1 |
| 9,313,914 B2 | 4/2016 | Judge et al. | |
| 9,681,749 B2 | 6/2017 | Chen et al. | |
| 10,485,132 B2 * | 11/2019 | Bold ................... | H05K 7/1489 |

(Continued)

FOREIGN PATENT DOCUMENTS

| CN | 108113270 B | 4/2021 |
|---|---|---|
| EP | 2897128 A2 | 7/2015 |

(Continued)

*Primary Examiner* — Andrew Roersma
(74) *Attorney, Agent, or Firm* — Best & Flanagan LLP (57) ABSTRACT

A slide rail mechanism includes a slide rail assembly and an auxiliary rail member. The slide rail assembly includes two slide rails. The auxiliary rail member is movably mounted to a first one of the two slide rails. When a second one of the two slide rails is detached from the first one of the two slide rails along an open direction, the auxiliary rail member is able to be moved from a retracted position to a predetermined extended position along the open direction relative to the first one of the two slide rails. The second one of the two slide rails is configured to carry a first carried object, and the auxiliary rail member is configured to carry a second carried object.

15 Claims, 12 Drawing Sheets

(56) References Cited

U.S. PATENT DOCUMENTS

| | | | |
|---|---|---|---|
| 2013/0272633 A1* | 10/2013 | Cheng | A47B 88/493 |
| | | | 384/49 |
| 2016/0227666 A1* | 8/2016 | Chen | H05K 7/1489 |
| 2017/0205857 A1* | 7/2017 | Moore | A47B 88/49 |
| 2019/0021495 A1* | 1/2019 | Nugent | A47B 88/80 |
| 2020/0107636 A1* | 4/2020 | Chen | H05K 7/183 |
| 2020/0337462 A1* | 10/2020 | Chen | A47B 88/70 |

FOREIGN PATENT DOCUMENTS

| | | | |
|---|---|---|---|
| EP | 3505007 | A1 | 7/2019 |
| WO | 00/65957 | A1 | 11/2000 |

* cited by examiner

SLIDE RAIL MECHANISM

BACKGROUND OF THE INVENTION

1. Field of the Invention

The present invention relates to a slide rail, and more particularly, to a slide rail mechanism having a slide rail assembly additionally arranged with at least one slide rail.

2. Description of the Prior Art

U.S. Pat. No. 9,681,749 B2 (hereinafter referred to as Patent '749) discloses a slide rail assembly, which comprises a first rail, a second rail and a third rail. The first rail is fixed to a rack. The second rail is movably mounted between the first rail and the third rail. The third rail is configured to carry a carried object, so that the carried object can be retracted or pulled out relative to the first rail (or the rack) through the third rail. Patent '749 discloses a general configuration of a three-sectional slide rail assembly, which can mount only one carried object to the rack.

U.S. Pat. No. 9,313,914 B2 (hereinafter referred to as Patent '914) discloses a conventional slide assembly, which comprises an outer slide segment, an intermediate slide segment and an inner slide segment. The intermediate slide segment has two C-shaped structures connected to each other in a back-to-back orientation. Patent '914 discloses the specially-shaped intermediate slide segment, but the slide assembly disclosed by Patent '914 is still a three-sectional slide assembly, which can mount only one carried object to a rack.

However, for different market requirements, it is important to develop various slide rail products.

SUMMARY OF THE INVENTION

The present invention provides a slide rail mechanism having slide rail assemblies additionally arranged with at least one slide rail and configured to allow two carried objects to be applied to a rack.

According to an embodiment of the present invention, a slide rail mechanism comprises a first slide rail assembly and a second slide rail assembly. The first slide rail assembly comprises a first rail, a second rail and a third rail. The second rail is movable relative to the first rail. The third rail is movable relative to the second rail. The second slide rail assembly is movable relative to the first slide rail assembly. The second slide rail assembly comprises an auxiliary rail member, a fourth rail and a fifth rail. The auxiliary rail member is movably mounted to the first rail. The fourth rail is connected to the auxiliary rail member. The fifth rail is movable relative to the fourth rail. The auxiliary rail member of the second slide rail assembly is configured to at least partially cover the first rail of the first slide rail assembly.

According to another embodiment of the present invention, a slide rail mechanism comprises a first slide rail assembly and an auxiliary rail member. The first slide rail assembly comprises a first rail, a second rail and a third rail. The second rail is movable relative to the first rail. The third rail is movable relative to the second rail. The auxiliary rail member is movably mounted to the first rail. When the first slide rail assembly is in an extended state, the second rail is located at a first extended position relative to the first rail, and the third rail is located at a second extended position relative to the second rail. When the third rail is detached from the second rail at the second extended position along an open direction, the auxiliary rail member is able to be moved from a retracted position to a predetermined extended position along the open direction relative to the first rail.

According to another embodiment of the present invention, a slide rail mechanism comprises a slide rail assembly and an auxiliary rail member. The slide rail assembly comprises two slide rails. The auxiliary rail member is movably mounted to a first one of the two slide rails. The first one of the two slide rails is configured to be mounted to a rack, a second one of the two slide rails is configured to carry a first carried object, and the auxiliary rail member is configured to carry a second carried object. When the second one of the two slide rails is detached from the first one of the two slide rails along an open direction, the auxiliary rail member is able to be moved from a retracted position to a predetermined extended position along the open direction relative to the first one of the two slide rails.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
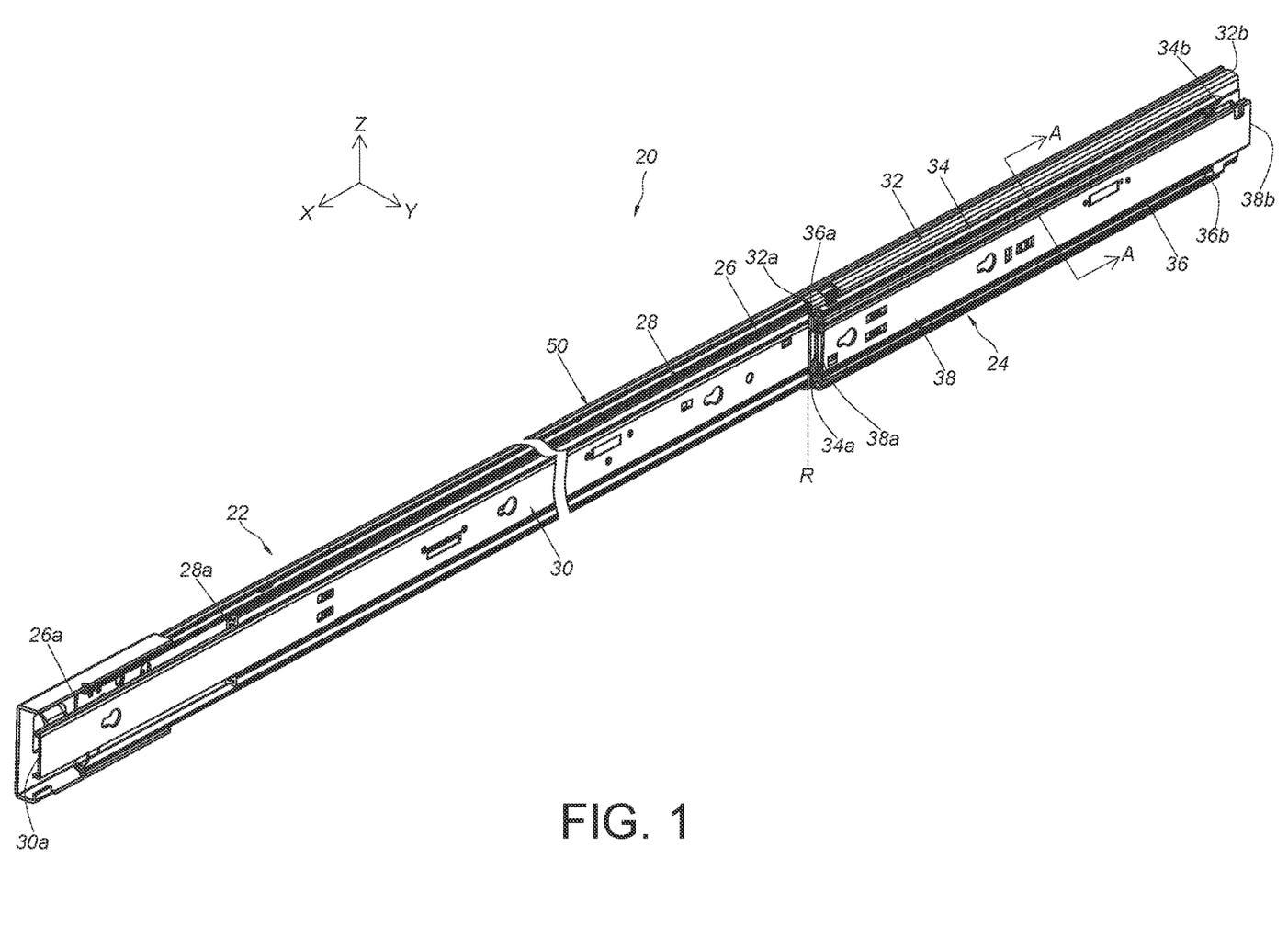
FIG. 1 is a diagram showing a slide rail mechanism according to a first embodiment of the present invention.
Figure 2:
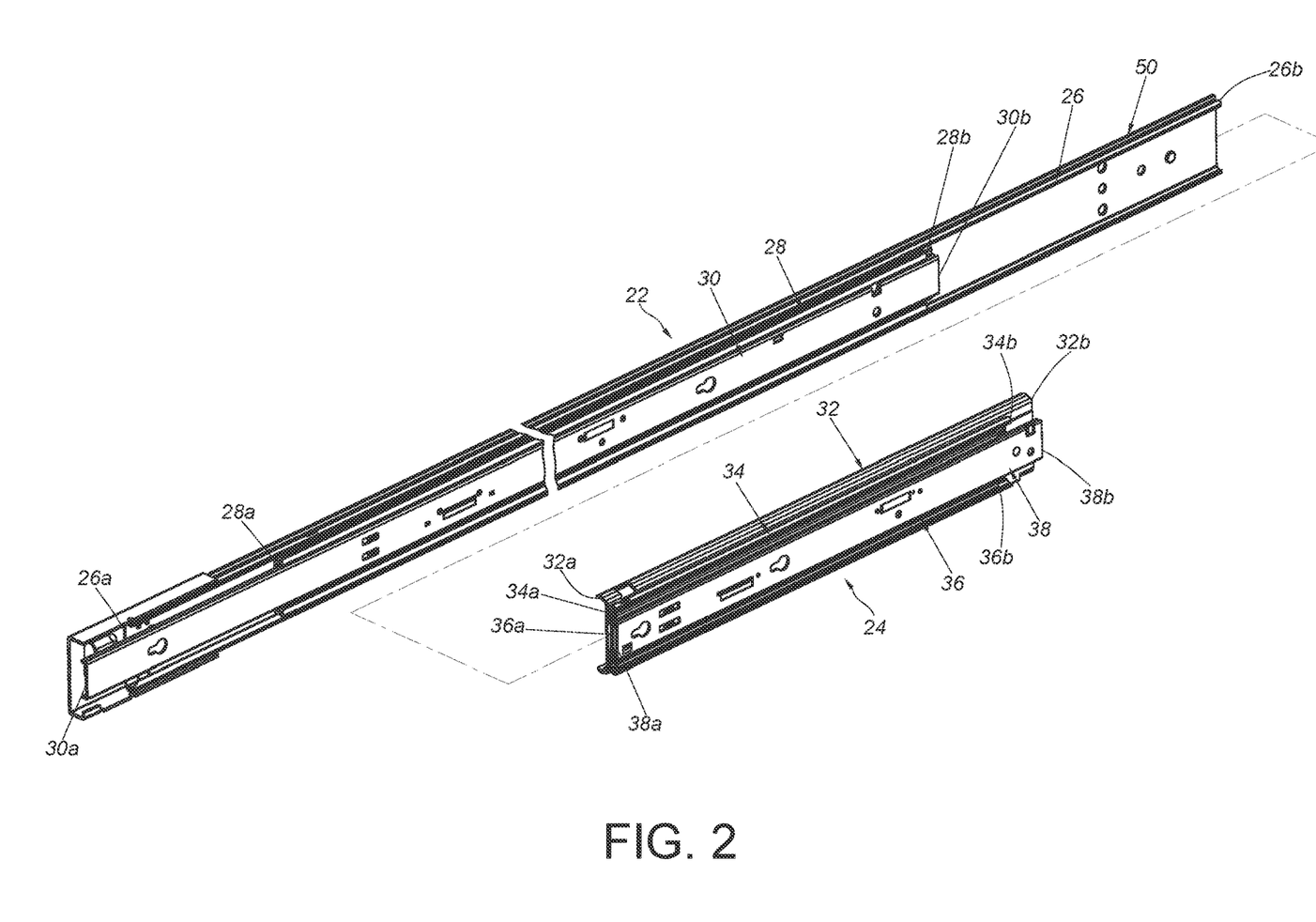
FIG. 2 is an exploded view of the slide rail mechanism according to the first embodiment of the present invention.

As shown in FIG. 1 and FIG. 2, a slide rail mechanism 20 comprises a first slide rail assembly 22 and a second slide rail assembly 24 according to a first embodiment of the present invention. The first slide rail assembly 22 comprises a first rail 26, a second rail 28, and a third rail 30 longitudinally movable relative to each other. Preferably, the second rail 28 is movably mounted between the first rail 26 and the third rail 30.

The second slide rail assembly 24 is movable relative to the first slide rail assembly 22. The second slide rail assembly 24 comprises an auxiliary rail member 32 (or an auxiliary slide rail), a fourth rail 34 and a fifth rail 36. Preferably, the second slide rail assembly 24 further comprises a sixth rail 38. The auxiliary rail member 32 is movably mounted on the first rail 26 of the first slide rail assembly 22. The fourth rail 34 is connected to the auxiliary rail member 32. In the present embodiment, the fourth rail 34 is fixedly connected to the auxiliary rail member 32, but the present invention is not limited thereto. Specifically, the fourth rail 34, the fifth rail 36 and the sixth rail 38 are longitudinally movable relative to each other. The auxiliary rail member 32 of the second slide rail assembly 24 at least partially covers the first rail 26 of the first slide rail assembly 22. Moreover, in the present embodiment, the X-axis is a longitudinal direction (or a length direction or a moving direction of the slide rail), the Y-axis is a transverse direction (or a lateral direction of the slide rail), and the Z-axis is a vertical direction (or a height direction of the slide rail).

Figure 3:
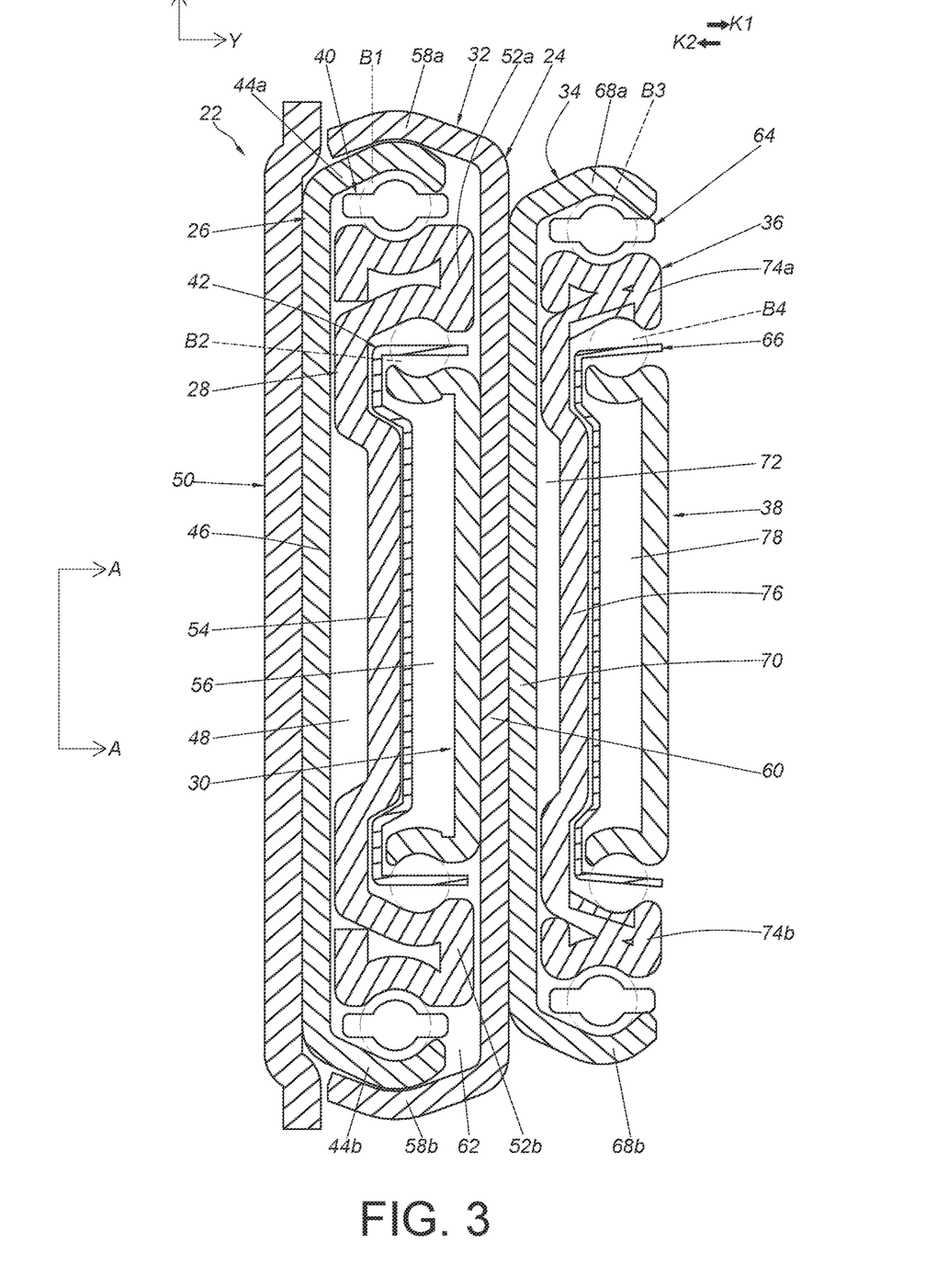
FIG. 3 is a cross-sectional view along line A-A of FIG. 1.

As shown in FIG. 3, the first slide rail assembly 22 further comprises a first slide assisting device 40 movably mounted between the first rail 26 and the second rail 28, and a second slide assisting device 42 movably mounted between the second rail 28 and the third rail 30. For example, the first slide assisting device 40 comprises at least one first rolling ball B1 configured to improve smoothness of relative movement between the first rail 26 and the second rail 28; the second slide assisting device 42 comprises at least one second rolling ball B2 configured to improve smoothness of relative movement between the second rail 28 and the third rail 30.

Preferably, the first rail 26 comprises a first wall 44a, a second wall 44b and a longitudinal wall 46 connected between the first wall 44a and the second wall 44b of the first rail 26. A first passage 48 is defined by the first wall 44a, the second wall 44b and the longitudinal wall 46 of the first rail 26 and configured to accommodate the second rail 28.

Preferably, the first slide rail assembly 22 further comprises a bracket 50 connected (such as fixedly connected) to one side of the longitudinal wall 46 of the first rail 26 opposite to the second rail 28. For example, the bracket 50 is connected to a back side of the longitudinal wall 46 of the first rail 26.

Preferably, the second rail 28 comprises a first wall 52a, a second wall 52b and a longitudinal wall 54 connected between the first wall 52a and the second wall 52b of the second rail 28. A second passage 56 is defined by the first wall 52a, the second wall 52b and the longitudinal wall 54 of the second rail 28 and configured to accommodate the third rail 30.

Preferably, the auxiliary rail member 32 comprises a first wall 58a, a second wall 58b and a longitudinal wall 60 connected between the first wall 58a and the second wall 58b of the auxiliary rail member 32. An auxiliary passage 62 is defined by the first wall 58a, the second wall 58b and the longitudinal wall 60 of the auxiliary rail member 32. The first wall 58a and the second wall 58b of the auxiliary rail member 32 are configured to hold the first wall 44a and the second wall 44b of the first rail 26 respectively, and the auxiliary passage 62 is configured to accommodate a portion of the first rail 26 of the first slide rail assembly 22.

Preferably, the first wall 44a and the second wall 44b of the first rail 26 are extended along a first predetermined direction K1 relative to the longitudinal wall 46 of the first rail 26. The first wall 58a and the second wall 58b of the auxiliary rail member 32 are extended along a second predetermined direction K2 relative to the longitudinal wall 60 of the auxiliary rail member 32. The first predetermined direction K1 is opposite to the second predetermined direction K2.

Preferably, the second slide rail assembly 24 further comprises a third slide assisting device 64 movably mounted between the fourth rail 34 and the fifth rail 36, and a fourth slide assisting device 66 movably mounted between the fifth rail 36 and the sixth rail 38. For example, the third slide assisting device 64 comprises at least one third rolling ball B3 configured to improve smoothness of relative movement between the fourth rail 34 and the fifth rail 36; the fourth slide assisting device 66 comprises at least one fourth rolling ball B4 configured to improve smoothness of relative movement between the fifth rail 36 and the sixth rail 38.

Preferably, the fourth rail 34 comprises a first wall 68a, a second wall 68b and a longitudinal wall 70 connected between the first wall 68a and the second wall 68b of the fourth rail 34. A third passage 72 is defined by the first wall 68a, the second wall 68b and the longitudinal wall 70 of the fourth rail 34 and configured to accommodate the fifth rail 36.

Preferably, the longitudinal wall 60 of the auxiliary rail member 32 and the longitudinal wall 70 of the fourth rail 34 are connected to each other (such as fixedly connected to each other).

Preferably, the first wall 68a and the second wall 68b of the fourth rail 34 are extended along the first predetermined direction K1 relative to the longitudinal wall 70 of the fourth rail 34.

Preferably, the fifth rail 36 comprises a first wall 74a, a second wall 74b and a longitudinal wall 76 connected between the first wall 74a and the second wall 74b of the fifth rail 36. A fourth passage 78 is defined by the first wall 74a, the second wall 74b and the longitudinal wall 76 of the fifth rail 36 and configured to accommodate the sixth rail 38.

As shown in FIG. 1 and FIG. 2, the first slide rail assembly 22 and the second slide rail assembly 24 are both in a retracted state. In addition, each of the first rail 26, the second rail 28 and the third rail 30 has a front part and a rear part. For example, the first rail 26 has a front part 26a and a rear part 26b; the second rail 28 has a front part 28a and a rear part 28b; and the third rail 30 has a front part 30a and a rear part 30b. On the other hand, each of the auxiliary rail member 32, the fourth rail 34, the fifth rail 36 and the sixth rail 38 has a front part and a rear part. For example, the auxiliary rail member 32 has a front part 32a and a rear part 32b; the fourth rail 34 has a front part 34a and a rear part 34b; the fifth rail 36 has a front part 36a and a rear part 36b; and the sixth rail 38 has a front part 38a and a rear part 38b.

Furthermore, when the first slide rail assembly 22 is in the retracted state, the second rail 28 is retracted relative to the first rail 26, and the third rail 30 is retracted relative to the second rail 28. On the other hand, when the second slide rail assembly 24 is in the retracted state, the auxiliary rail member 32 and the fourth rail 34 are located at a retracted position R relative to the first rail 26 to be adjacent to a rear rail section of the first rail 26, the fifth rail 36 is retracted relative to the fourth rail 34, and the sixth rail 38 is retracted relative to the fifth rail 36.

Figure 4:
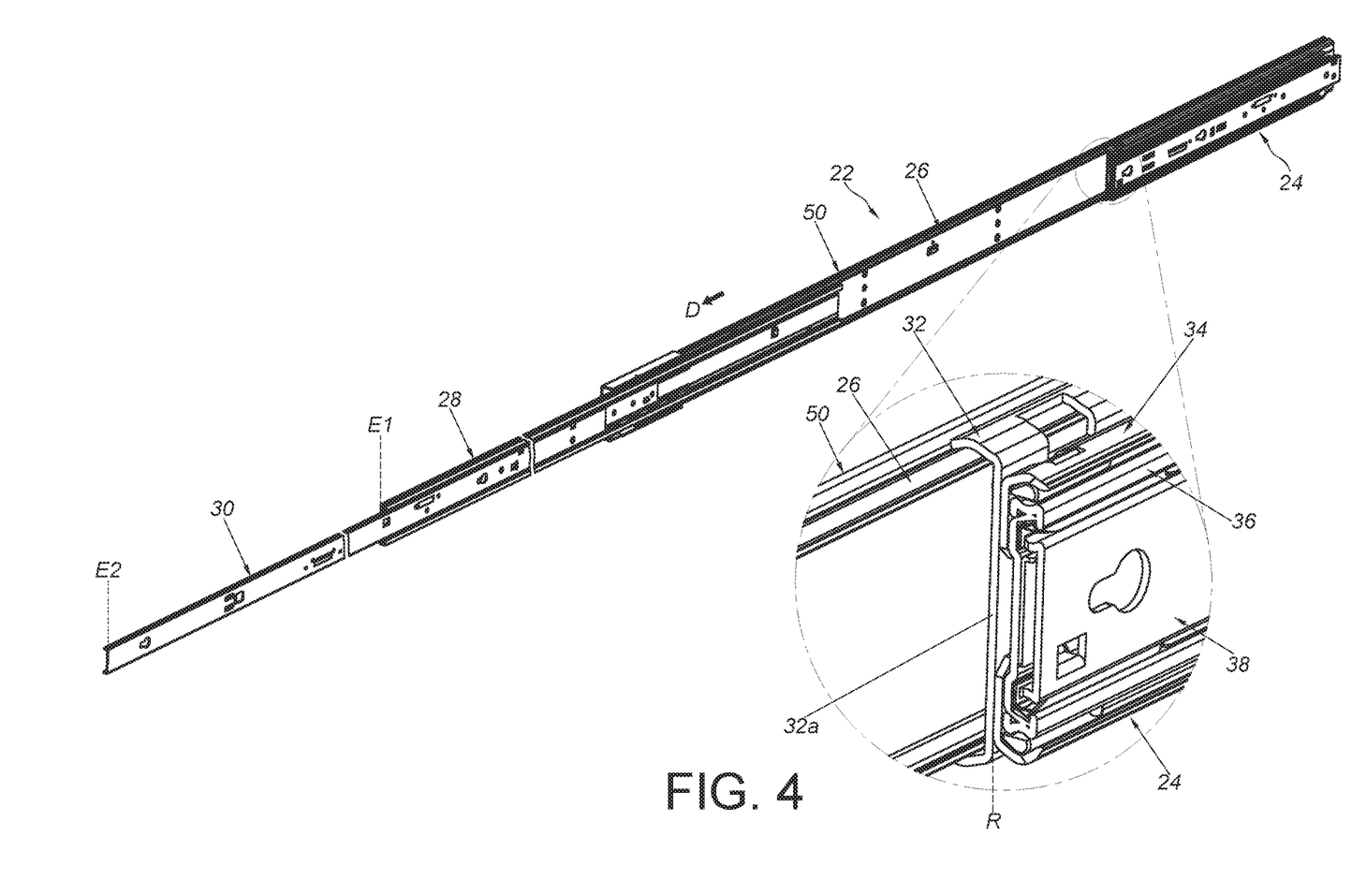
FIG. 4 is a diagram showing a first slide rail assembly of the slide rail mechanism being in an extended state and a second slide rail assembly of the slide rail mechanism being in a retracted state according to the first embodiment of the present invention.
Figure 5:
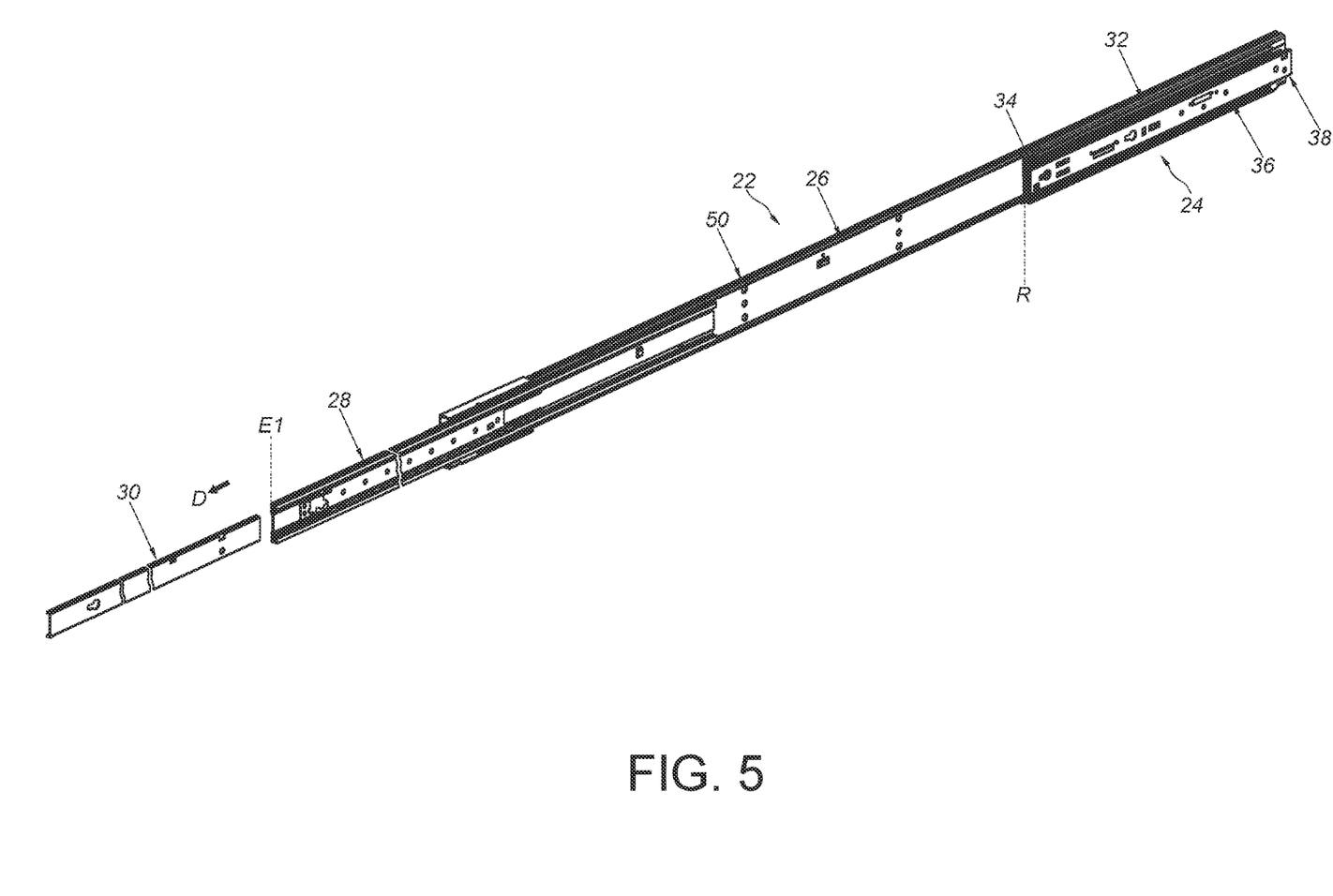
FIG. 5 is a diagram showing a third rail of the first slide rail assembly of the slide rail mechanism being detached relative to a first rail, and the second slide rail assembly of the slide rail mechanism being in the retracted state relative to the first rail according to the first embodiment of the present invention.

As shown in FIG. 4 and FIG. 5, the first slide rail assembly 22 is in an extended state. Specifically, the second rail 28 is movable relative to the first rail 26 along an open direction D to a first extended position E1, and the third rail 30 is movable relative to the second rail 28 along the open direction D to a second extended position E2 (as shown in FIG. 4). Furthermore, the third rail 30 can be moved and detached from the second rail 28 at the second extended position E2 along the open direction D (as shown in FIG. 5).

Figure 6:
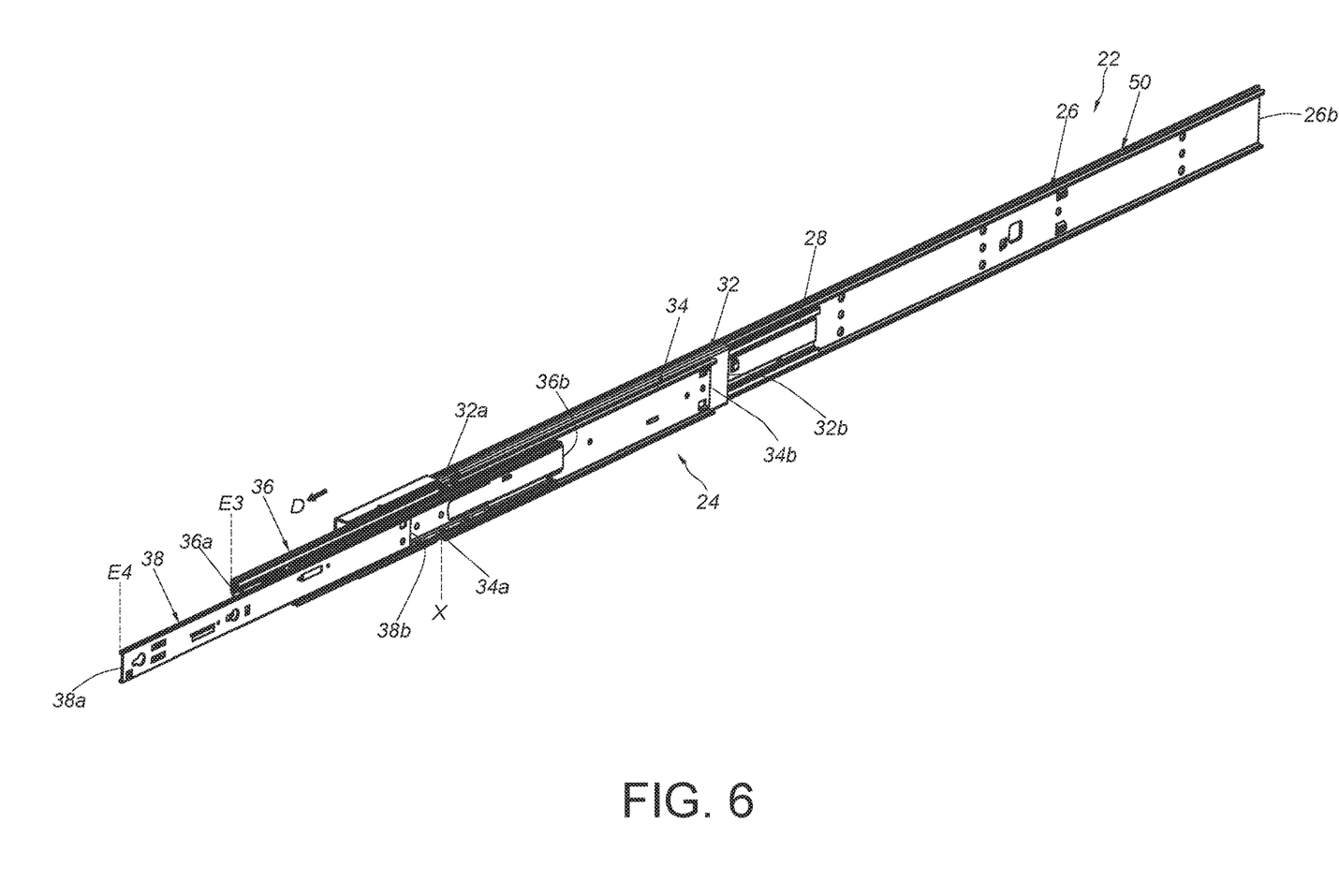
FIG. 6 is a diagram showing the second slide rail assembly of the slide rail mechanism being in an extended state relative to the first rail according to the first embodiment of the present invention.

As shown in FIG. 6, when the third rail 30 is detached from the second rail 28, the auxiliary rail member 32 and the fourth rail 34 can be moved relative to the first rail 26 from the retracted position R along the open direction D to a predetermined extended position X, the fifth rail 36 can be moved relative to the fourth rail 34 along the open direction D to a third extended position E3, and the sixth rail 38 can be moved relative to the fifth rail 36 along the open direction D to a fourth extended position E4. Preferably, the sixth rail 38 can be moved and detached from the fifth rail 36 at the fourth extended position E4 along the open direction D (not shown in figures).

Figure 7:
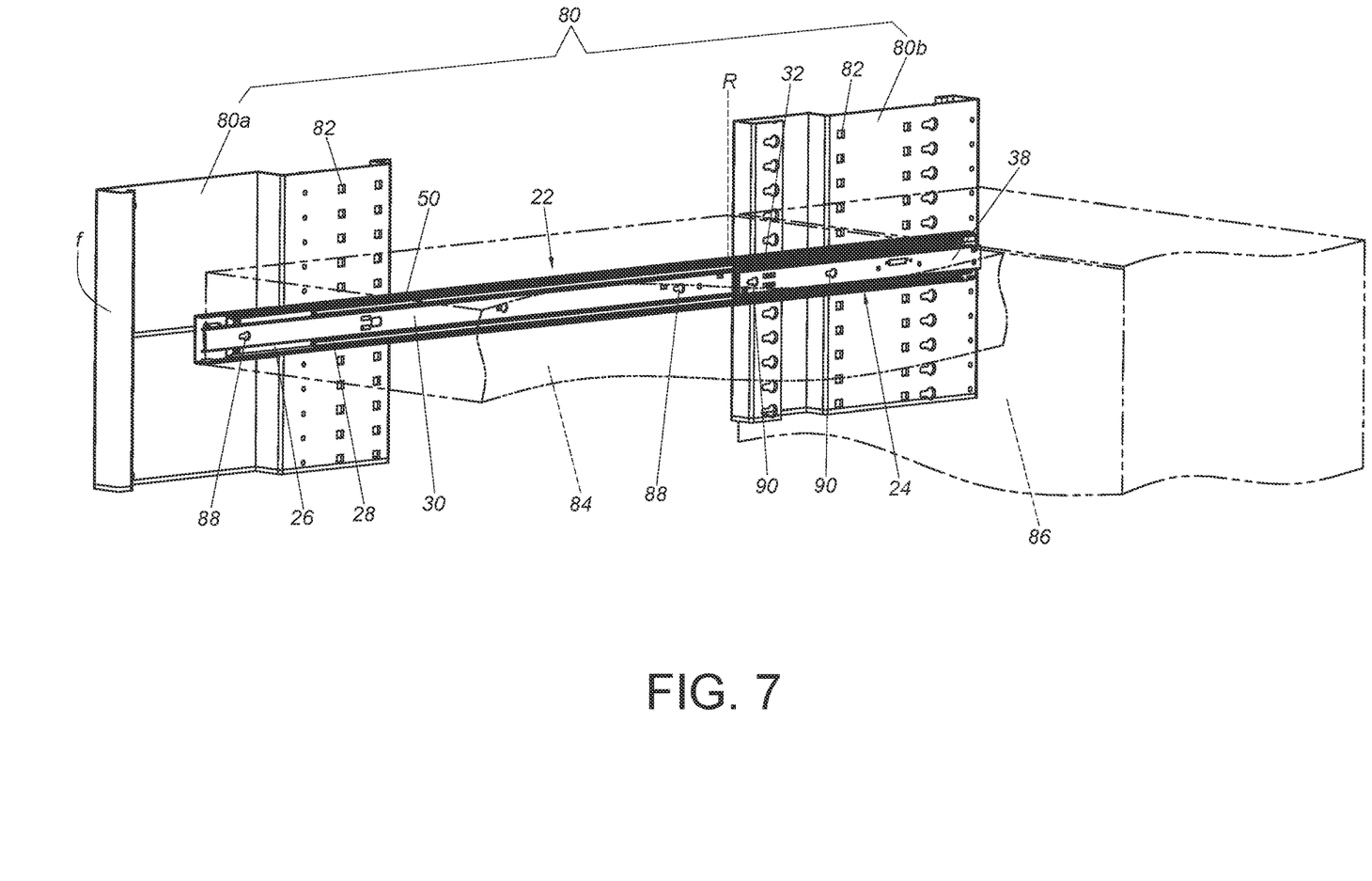
FIG. 7 is a diagram showing the slide rail mechanism being mounted to a rack with both the first slide rail assembly and the second slide rail assembly of the slide rail mechanism being in the retracted state and configured to carry a first carried object and a second carried object respectively according to the first embodiment of the present invention.

As shown in FIG. 7, the first rail 26 is mounted to a rack 80 (or a post), such as mounted to a front part 80a and a rear part 80b of the rack 80. In the present embodiment, the first rail 26 is mounted to the front part 80a and the rear part 80b of the rack 80 through the bracket 50. The rack 80 has a plurality of mounting features 82 for mounting the bracket 50. On the other hand, the third rail 30 is configured to carry a first carried object 84, and the sixth rail 38 is configured to carry a second carried object 86. For example, the third rail 30 comprises at least one first connecting feature 88 configured to mount the first carried object 84, and the sixth rail 38 comprises at least one second connecting feature 90 configured to mount the second carried object 86. Each of the first carried object 84 and the second carried object 86 can be a chassis, an electronic device or a drawer, but the present invention is not limited thereto.

Furthermore, when the first slide rail assembly 22 and the second slide rail assembly 24 are both in the retracted state, the second rail 28 is retracted relative to the first rail 26, and the third rail 30 is retracted relative to the second rail 28, such that the third rail 30 (and the first carried object 84) is located inside the rack 80. For example, the third rail 30 (and the first carried object 84) is not extended beyond a front end f of the front part 80a of the rack 80; and the sixth rail 38 (and the second carried object 86) is also located inside the rack 80, and the second carried object 86 is located behind the first carried object 84.

Figure 8:
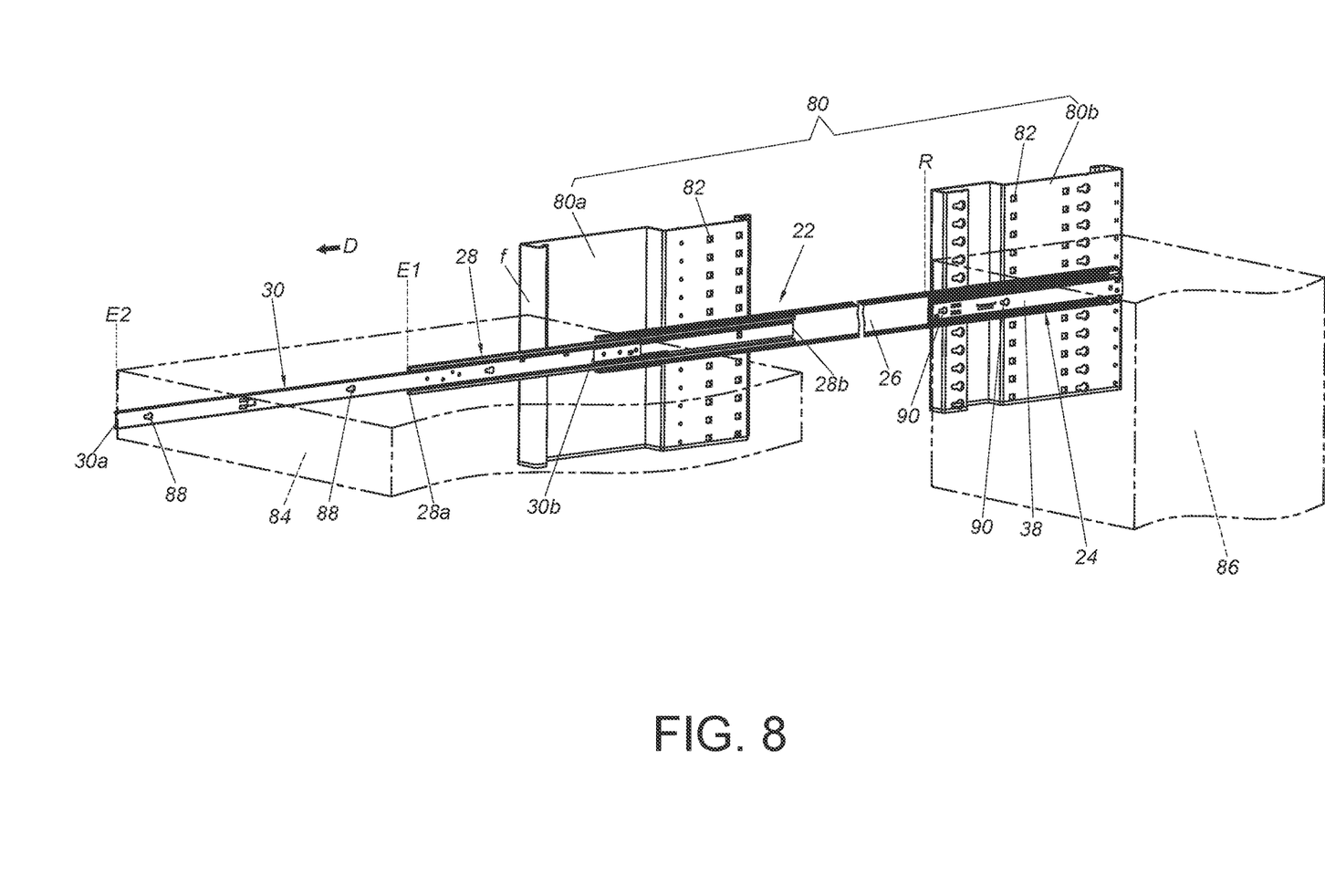
FIG. 8 is a diagram showing the slide rail mechanism being mounted to the rack with the first slide rail assembly being in the extended state and the second slide rail assembly being in the retracted state according to the first embodiment of the present invention.
Figure 9:
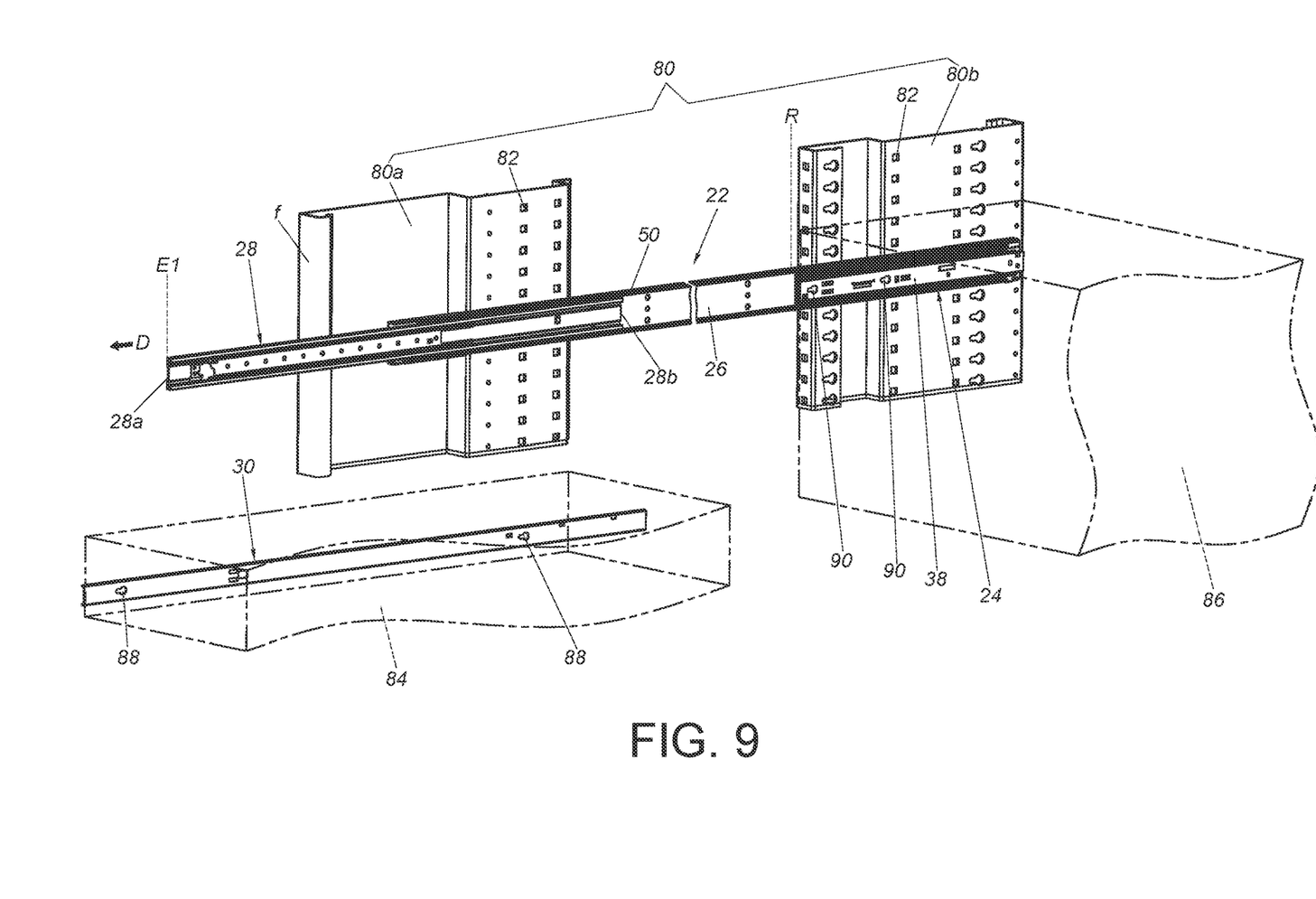
FIG. 9 is a diagram showing the slide rail mechanism being mounted to the rack with the first carried object being detached and the second slide rail assembly being in the retracted state according to the first embodiment of the present invention.

As shown in FIG. 8 and FIG. 9, the first slide rail assembly 22 is in the extended state. Specifically, the second rail 28 is configured to be moved relative to the first rail 26 along the open direction D to the first extended position E1, and the third rail 30 is configured to be moved relative to the second rail 28 along the open direction D to the second extended position E2 (as shown in FIG. 8). In such state, the third rail 30 (and the first carried object 84) is located outside the rack 80, such that it is convenient for a user to perform maintenance on the first carried object 84. The front part 30a of the third rail 30 is extended beyond the front end f of the front part 80a of the rack 80. Moreover, the third rail 30 and the first carried object 84 can be moved and detached from the second rail 28 at the second extended position E2 along the open direction D (as shown in FIG. 9).

Figure 10:
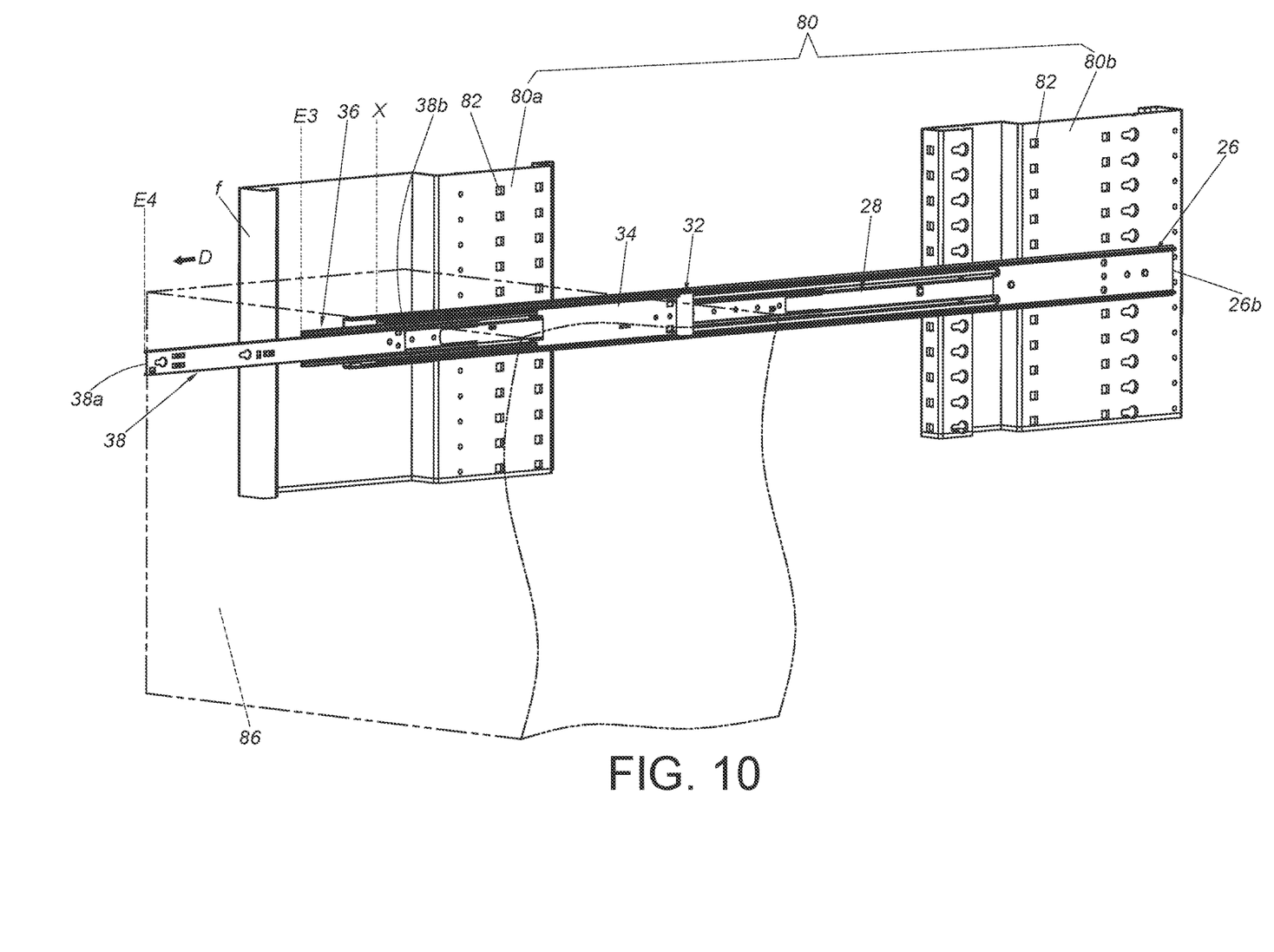
FIG. 10 is a diagram showing the slide rail mechanism being mounted to the rack with the second slide rail assembly being in the extended state according to the first embodiment of the present invention.

As shown in FIG. 10, after the third rail 30 and the first carried object 84 are detached from the second rail 28, the auxiliary rail member 32 and the fourth rail 34 can be moved relative to the first rail 26 from the retracted position R along the open direction D to the predetermined extended position X, the fifth rail 36 can be moved relative to the fourth rail 34 along the open direction D to the third extended position E3, and the sixth rail 38 can be moved relative to the fifth rail 36 along the open direction D to the fourth extended position E4. In such state, the sixth rail 38 (and the second carried object 86) is located outside the rack 80, such that it is convenient for the user to perform maintenance on the second carried object 86. The front part 38a of the sixth rail 38 is extended beyond the front end f of the front part 80a of the rack 80. Preferably, the sixth rail 38 can be moved and detached from the fifth rail 36 at the fourth extended position E4 along the open direction D (not shown in figures).

Figure 11:
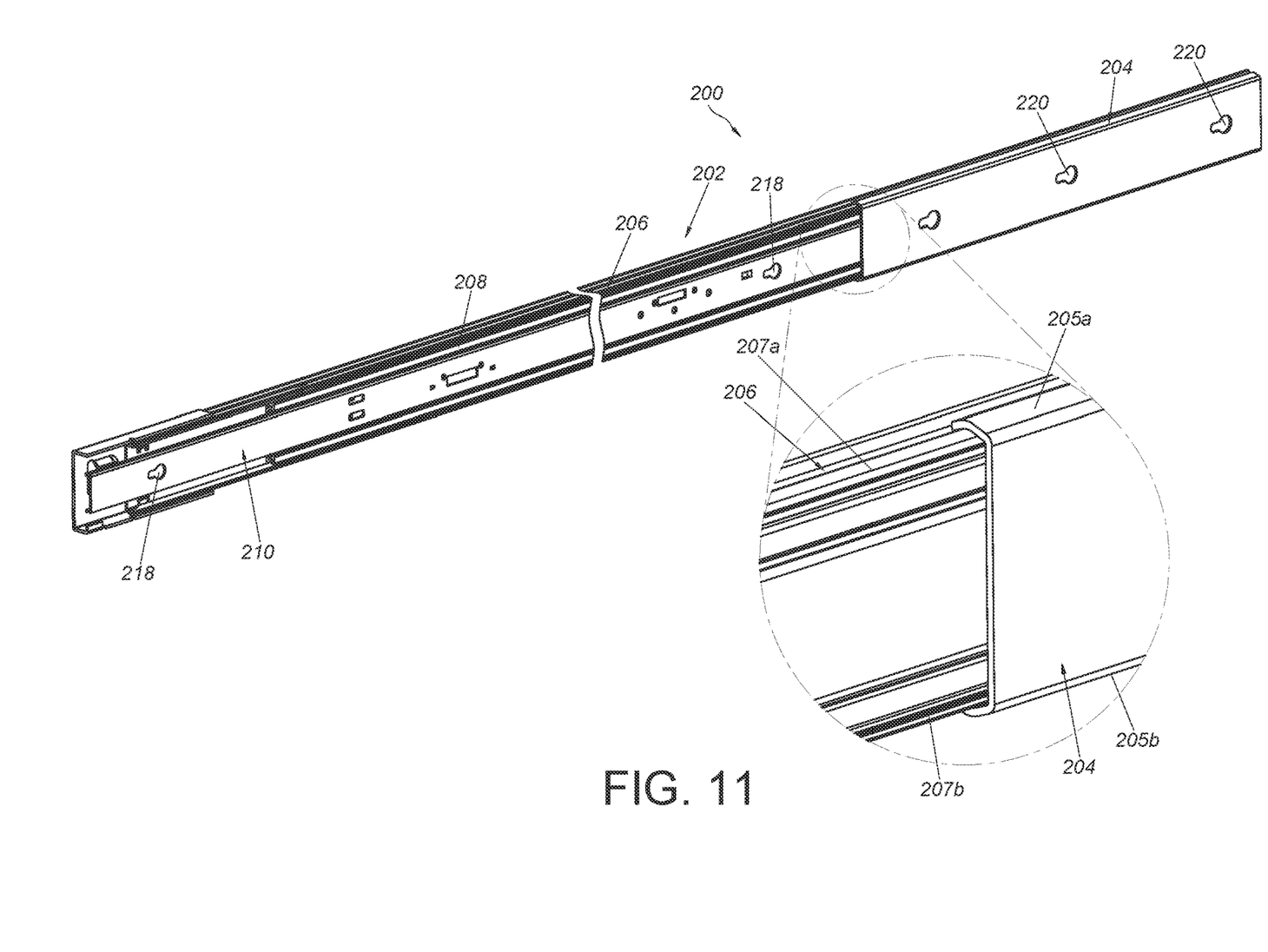
FIG. 11 is a diagram showing a slide rail mechanism according to a second embodiment of the present invention.
Figure 12:
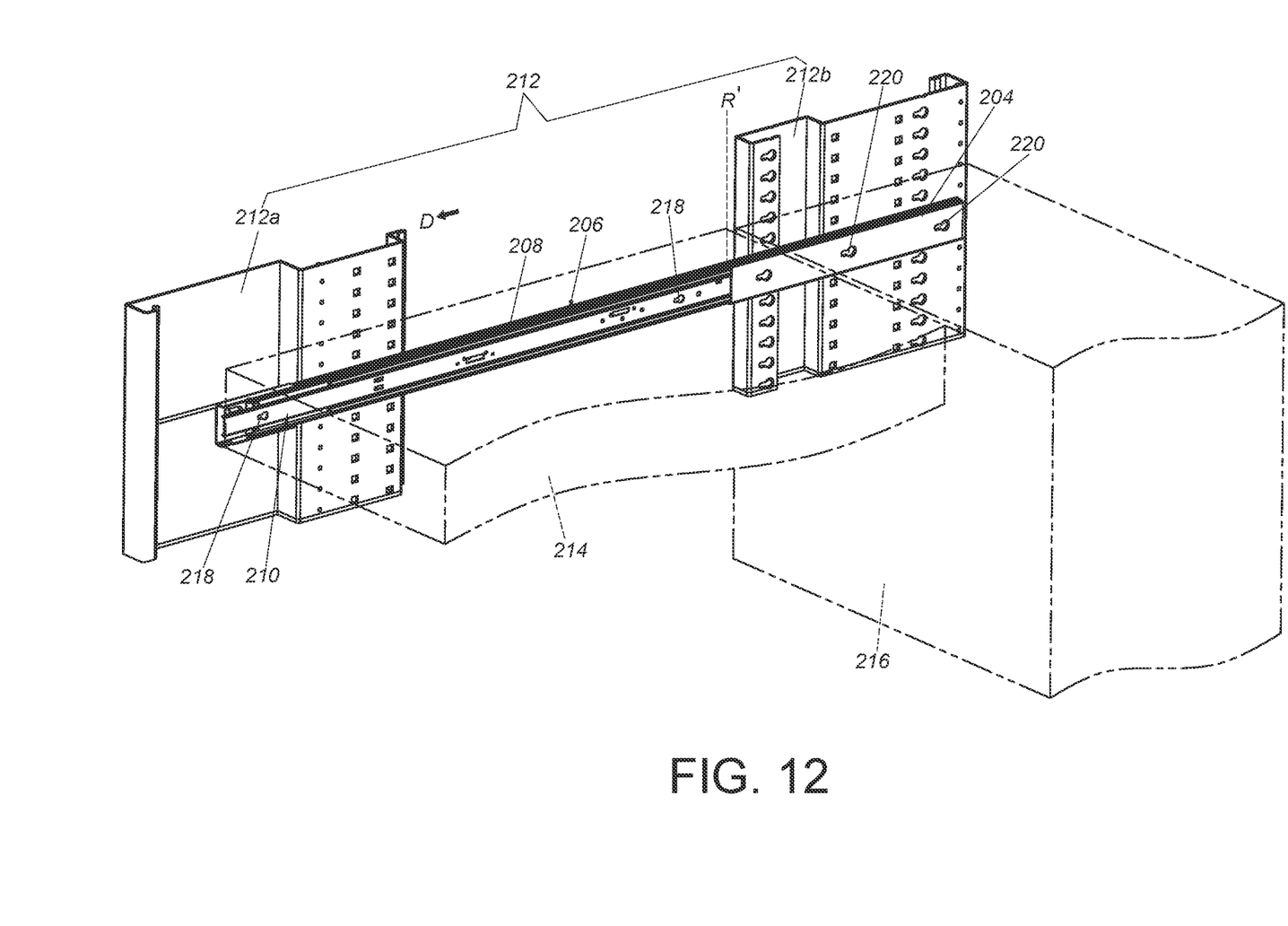
FIG. 12 is a diagram showing the slide rail mechanism being mounted to a rack with a first slide rail assembly being configured to carry a first carried object and a slide rail being configured to carry a second carried object according to the second embodiment of the present invention.

FIG. 11 and FIG. 12 show a slide rail mechanism 200 according to a second embodiment of the present invention. Specifically, different from the first embodiment comprising the second slide rail assembly 24 composed of a plurality of slide rails, the second embodiment replaces the second slide rail assembly 24 by a slide rail (such as an auxiliary rail member 204).

Specifically, the slide rail mechanism 200 comprises a first slide rail assembly 202 (also referred to as a slide rail assembly) and an auxiliary rail member 204. The first slide rail assembly 202 comprises a first rail 206, a second rail 208, and a third rail 210 longitudinally movable relative to each other. The auxiliary rail member 204 is movably mounted on the first rail 206. A first wall 205a and a second wall 205b of the auxiliary rail member 204 are configured to respectively hold a first wall 207a and a second wall 207b of the first rail 206. (structural configuration between the auxiliary rail member 204 and the first rail 206 can refer to the first embodiment, for simplification, no further illustration is provided) The first rail 206 is configured to be mounted to a rack 212, such as to a front part 212a and a rear part 212b of the rack 212. The third rail 210 is configured to carry a first carried object 214. The auxiliary rail member 204 is configured to carry a second carried object 216. For example, the third rail 210 comprises at least one first connecting feature 218 configured to mount the first carried object 214, and the auxiliary rail member 204 comprises at least one second connecting feature 220 configured to mount the second carried object 216.

When the first carried object 214 is moved relative to the second rail 208 or the first rail 206 through the third rail 210 along the open direction D to be detached, the second carried object 216 can be moved relative to the first rail 206 through the auxiliary rail member 204 from a retracted position R' along the open direction D to a predetermined extended position. As such, it is convenient for the user to perform maintenance on the second carried object 216. Such configuration has been disclosed in the first embodiment, for simplification, no further illustration is provided.

Therefore, the slide rail mechanism (20, 200) according to the embodiments of the present invention has the following technical features:

1. The sliding rail mechanism (20, 200) comprises the first slide rail assembly (22, 202) and the second slide rail assembly 24 (or the auxiliary rail member 204).

2. When being mounted to the rack (80, 212), the first slide rail assembly (22, 202) is configured to carry the first carried object (84, 214), and the first carried object (84, 214) can be moved close to the front part of the rack, such that it is convenient for the user to perform maintenance on the first carried object (84, 214); or the first carried object (84, 214) can be detached to allow the second carried object (86, 216) carried by the second slide rail assembly 24 (or the auxiliary rail member 204) to move close to the front part of the rack, such that it is convenient for the user to perform maintenance on the second carried object (86, 216).

3. Structure or connection configuration (as shown in FIG. 3) between the first slide rail assembly (22, 202) and the second slide rail assembly 24 (or the auxiliary rail member 204) is more innovative than a conventional three-sectional slide rail assembly, and is useful to carry at least two carried objects.

4. The first wall 44a and the second wall 44b of the first rail 26 are extended along the first predetermined direction K1 relative to the longitudinal wall 46 of the first rail 26. The first wall 58a and the second wall 58b of the auxiliary rail member 32 are extended along the second predetermined direction K2 relative to the longitudinal wall 60 of the auxiliary rail member 32. The first predetermined direction K1 is opposite to the second predetermined direction K2.

5. The first wall 68a and the second wall 68b of the fourth rail 34 are extended along the first predetermined direction K1 relative to the longitudinal wall 70 of the fourth rail 34.

6. The longitudinal wall 60 of the auxiliary rail member 32 and the longitudinal wall 70 of the fourth rail 34 are connected to each other (such as fixedly connected to each other).

7. Since the second slide rail assembly 24 is attached to the first slide rail assembly 22, the slide rail mechanism 20 can be mounted with two carried objects, such as the first carried object 84 and the second carried object 86, in a space with a limited height, such that the first carried object 84 and the second carried object 86 can be respectively opened relative to the rack 80 along the open direction to facilitate maintenance operation of the user.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail mechanism, comprising:
   a first slide rail assembly comprising:
      a first rail;
      a second rail movable relative to the first rail; and
      a third rail movable relative to the second rail; and
   a second slide rail assembly movable relative to the first slide rail assembly, the second slide rail assembly comprising:
      an auxiliary rail member movably mounted to the first rail;
      a fourth rail connected to the auxiliary rail member; and
      a fifth rail movable relative to the fourth rail;
   wherein the auxiliary rail member of the second slide rail assembly is configured to at least partially cover the first rail of the first slide rail assembly;
   wherein the first rail comprises a first wall, a second wall and a longitudinal wall connected between the first wall and the second wall of the first rail, and a first passage is defined by the first wall, the second wall and the longitudinal wall of the first rail and configured to accommodate the second rail;
   wherein the second rail comprises a first wall, a second wall and a longitudinal wall connected between the first wall and the second wall of the second rail, and a second passage is defined by the first wall, the second wall and the longitudinal wall of the second rail and configured to accommodate the third rail;
   wherein the auxiliary rail member comprises a first wall, a second wall and a longitudinal wall connected between the first wall and the second wall of the auxiliary rail member, and an auxiliary passage is defined by the first wall, the second wall and the longitudinal wall of the auxiliary rail member; wherein the first wall and the second wall of the auxiliary rail member are configured to respectively hold the first wall and the second wall of the first rail; wherein the auxiliary passage is configured to accommodate a portion of the first rail of the first slide rail assembly.

2. The slide rail mechanism of claim 1, wherein the first slide rail assembly further comprises a first slide assisting device movably mounted between the first rail and the second rail.

3. The slide rail mechanism of claim 2, wherein the first slide rail assembly further comprises a second slide assisting device movably mounted between the second rail and the third rail.

4. The slide rail mechanism of claim 1, wherein the first wall and the second wall of the first rail are extended along a first predetermined direction relative to the longitudinal wall of the first rail, and the first wall and the second wall of the auxiliary rail member are extended along a second predetermined direction relative to the longitudinal wall of the auxiliary rail member, wherein the first predetermined direction is opposite to the second predetermined direction.

5. The slide rail mechanism of claim 4, wherein the second slide rail assembly further comprises a sixth rail movable relative to the fifth rail.

6. The slide rail mechanism of claim 5, wherein the second slide rail assembly further comprises a third slide assisting device movably mounted between the fourth rail and the fifth rail, and a fourth slide assisting device movably mounted between the fifth rail and the sixth rail.

7. The slide rail mechanism of claim 5, wherein the fourth rail comprises a first wall, a second wall and a longitudinal wall connected between the first wall and the second wall of the fourth rail, and a third passage is defined by the first wall, the second wall and the longitudinal wall of the fourth rail and configured to accommodate the fifth rail.

8. The slide rail mechanism of claim 7, wherein the fifth rail comprises a first wall, a second wall and a longitudinal wall connected between the first wall and the second wall of the fifth rail, and a fourth passage is defined by the first wall, the second wall and the longitudinal wall of the fifth rail and configured to accommodate the sixth rail.

9. The slide rail mechanism of claim 7, wherein the first wall and the second wall of the fourth rail are extended along the first predetermined direction relative to the longitudinal wall of the fourth rail.

10. A slide rail mechanism, comprising:
    a first slide rail assembly comprising:
       a first rail;
       a second rail movable relative to the first rail; and
       a third rail movable relative to the second rail; and a second slide rail assembly movable relative to the first slide rail assembly, the second slide rail assembly comprising:
  an auxiliary rail member movably mounted to the first rail;
  a fourth rail connected to the auxiliary rail member;
  a fifth rail movable relative to the fourth rail; and
  a sixth rail movable relative to the fifth rail;
  wherein when the first slide rail assembly is in an extended state, the second rail is located at a first extended position relative to the first rail, and the third rail is located at a second extended position relative to the second rail;
  wherein when the third rail is detached from the second rail at the second extended position along an open direction, the auxiliary rail member is able to be moved from a retracted position to a predetermined extended position along the open direction relative to the first rail.

11. The slide rail mechanism of claim 10, wherein the first rail is configured to be mounted to a rack, the third rail is configured to carry a first carried object, and the sixth rail is configured to carry a second carried object.

12. The slide rail mechanism of claim 10, wherein the first rail comprises a first wall, a second wall and a longitudinal wall connected between the first wall and the second wall of the first rail, and a first passage is defined by the first wall, the second wall and the longitudinal wall of the first rail and configured to accommodate the second rail; wherein the second rail comprises a first wall, a second wall and a longitudinal wall connected between the first wall and the second wall of the second rail, and a second passage is defined by the first wall, the second wall and the longitudinal wall of the second rail and configured to accommodate the third rail; the auxiliary rail member comprises a first wall, a second wall and a longitudinal wall connected between the first wall and the second wall of the auxiliary rail member, and an auxiliary passage is defined by the first wall, the second wall and the longitudinal wall of the auxiliary rail member; wherein the first wall and the second wall of the auxiliary rail member are configured to respectively hold the first wall and the second wall of the first rail; wherein the auxiliary passage is configured to accommodate a portion of the first rail of the first slide rail assembly.

13. The slide rail mechanism of claim 12, wherein the first wall and the second wall of the first rail are extended along a first predetermined direction relative to the longitudinal wall of the first rail, and the first wall and the second wall of the auxiliary rail member are extended along a second predetermined direction relative to the longitudinal wall of the auxiliary rail member, wherein the first predetermined direction is opposite to the second predetermined direction.

14. The slide rail mechanism of claim 13, wherein the fourth rail comprises a first wall, a second wall and a longitudinal wall connected between the first wall and the second wall of the fourth rail, and a third passage is defined by the first wall, the second wall and the longitudinal wall of the fourth rail and configured to accommodate the fifth rail; wherein the fifth rail comprises a first wall, a second wall and a longitudinal wall connected between the first wall and the second wall of the fifth rail, and a fourth passage is defined by the first wall, the second wall and the longitudinal wall of the fifth rail and configured to accommodate the sixth rail; wherein the first wall and the second wall of the fourth rail are extended along the first predetermined direction relative to the longitudinal wall of the fourth rail.

15. A slide rail mechanism, comprising:
  a slide rail assembly comprising two slide rails; and
  an auxiliary rail member movably mounted to a first one of the two slide rails;
  wherein the first one of the two slide rails is configured to be mounted to a rack, a second one of the two slide rails is configured to carry a first carried object, and the auxiliary rail member is configured to carry a second carried object;
  wherein when the second one of the two slide rails is detached from the first one of the two slide rails along an open direction, the auxiliary rail member is able to be moved from a retracted position to a predetermined extended position along the open direction relative to the first one of the two slide rails;
  wherein the first one of the two slide rails comprises a first wall, a second wall and a longitudinal wall connected between the first wall and the second wall of the first one of the two slide rails, and the auxiliary rail member comprises a first wall, a second wall and a longitudinal wall connected between the first wall and the second wall of the auxiliary rail member, an auxiliary passage is defined by the first wall, the second wall and the longitudinal wall of the auxiliary rail member; wherein the first wall and the second wall of the auxiliary rail member are configured to respectively hold the first wall and the second wall of the first one of the two slide rails; wherein the auxiliary passage is configured to accommodate a portion of the one of the two slide rails.

* * * * *